(12) United States Patent
Tominaga et al.

(10) Patent No.: US 9,429,471 B2
(45) Date of Patent: Aug. 30, 2016

(54) PHOTODIODE ARRAY FOR SPECTROMETRIC MEASUREMENTS AND SPECTROMETRIC MEASUREMENT SYSTEM

(71) Applicants: SHIMADZU CORPORATION, Kyoto-shi, Kyoto (JP); TOHOKU UNIVERSITY, Sendai-shi, Miyagi (JP)

(72) Inventors: Hideki Tominaga, Uji (JP); Ryuta Hirose, Kizugawa (JP); Kenji Takubo, Uji (JP); Shigetoshi Sugawa, Sendai (JP); Rihito Kuroda, Sendai (JP)

(73) Assignees: SHIMADZU CORPORATION, Kyoto (JP); TOHOKU UNIVERSITY, Sendai (JP)

( * ) Notice: Subject to any disclaimer, the term of this patent is extended or adjusted under 35 U.S.C. 154(b) by 70 days.

(21) Appl. No.: 14/388,567

(22) PCT Filed: Mar. 26, 2013

(86) PCT No.: PCT/JP2013/058857
§ 371 (c)(1),
(2) Date: Sep. 26, 2014

(87) PCT Pub. No.: WO2013/146816
PCT Pub. Date: Oct. 3, 2013

(65) Prior Publication Data
US 2015/0048239 A1 Feb. 19, 2015

(30) Foreign Application Priority Data

Mar. 27, 2012 (JP) ................................. 2012-072050

(51) Int. Cl.
| | | |
|---|---|---|
| *H01L 27/00* | (2006.01) | |
| *G01J 3/28* | (2006.01) | |
| *G02B 1/116* | (2015.01) | |
| *H01L 27/146* | (2006.01) | |
| *G01J 3/02* | (2006.01) | |
| *G01J 3/12* | (2006.01) | |

(52) U.S. Cl.
CPC ............ *G01J 3/2803* (2013.01); *G01J 3/0213* (2013.01); *G01J 3/0229* (2013.01); *G02B 1/116* (2013.01);

(Continued)

(58) Field of Classification Search
CPC ........................... H01L 27/14643; G01J 3/28
USPC ................................ 250/208.1, 226; 257/437
See application file for complete search history.

(56) References Cited

U.S. PATENT DOCUMENTS

| | | | |
|---|---|---|---|
| 5,460,888 A | 10/1995 | Hashimoto et al. | |
| 7,901,870 B1 * | 3/2011 | Wach .................. | G02B 5/2858 430/321 |
| 2003/0067645 A1 * | 4/2003 | Ibsen .................... | G01J 3/02 398/79 |

FOREIGN PATENT DOCUMENTS

| | | |
|---|---|---|
| DE | 10 2009 021936 | 11/2010 |
| JP | 05-188202 A | 7/1993 |

(Continued)

OTHER PUBLICATIONS

"NMOS linear image sensor S3901/S3904 series", Hamamatsu Photonics K. K., [searched on Jan. 17, 2012], the Internet.

(Continued)

*Primary Examiner* — Kevin Pyo
(74) *Attorney, Agent, or Firm* — Sughrue Mion, PLLC (57) ABSTRACT

A plurality of photodiodes arrayed in a one-dimensional form are divided into a plurality of groups. The structure of an antireflection coating is changed for each group so that all the surfaces of the photodiodes belonging to each group are covered with an antireflection coating having a transmittance characteristic which shows a maximum transmittance within a range of wavelengths of light to be received by those photodiodes. In particular, a $SiO_2$ coating layer on the silicon substrate and an $Al_2O_3$ coating layer are common to all the photodiodes, while the structure of the upper layers are modified with respect to the wavelength. Within an ultraviolet wavelength region, the coating structure is more finely changed with respect to the wavelength. By such a design, the transmittance can be improved while making the best efforts to avoid a complex manufacturing process.

10 Claims, 10 Drawing Sheets

(52) U.S. Cl.
CPC ..... *H01L 27/1462* (2013.01); *H01L 27/14643* (2013.01); *G01J 2003/123* (2013.01); *G01J 2003/1234* (2013.01); *G01J 2003/2806* (2013.01)

(56) References Cited

FOREIGN PATENT DOCUMENTS

| | | |
|---|---|---|
| JP | 2001-013304 A | 1/2001 |
| JP | 2003-139611 A | 5/2003 |
| WO | 94/15185 | 7/1994 |

OTHER PUBLICATIONS

International Search Report of PCT/JP2013/058857 dated Jul. 9, 2013.

European Search Report issued Mar. 19, 2015 in European Patent Application No. 13767497.4.

* cited by examiner

Fig. 1

(a) TOP VIEW (b) SECTIONAL VIEW

Fig. 2

| MATERIAL WAVELENGTH [nm] | DIELECTRIC |  |  |  |  |  |  |  |  |  |  |  |  |  | METAL |  |  |  |
|---|---|---|---|---|---|---|---|---|---|---|---|---|---|---|---|---|---|---|
|  | SiO$_2$ |  | Al$_2$O$_3$ |  | Y$_2$O$_3$ |  | MgF$_2$ |  | HfO$_2$ |  | TiO$_2$ |  | Si$_3$N$_4$ |  | Al |  | Ag |  |
|  | n | k | n | k | n | k | n | k | n | k | n | k | n | k | n | k | n | k |
| 200 | 1.55 | 0.00 | 1.83 | 0.00 | 2.63 | 0.19 | 1.42 | 0.00 | 1.58 | 0.25 | 1.52 | 1.72 | 2.60 | 0.16 | 0.12 | 2.30 | 1.07 | 1.24 |
| 225 | 1.52 | 0.00 | 1.83 | 0.00 | 2.32 | 0.00 | 1.41 | 0.00 | 2.08 | 0.02 | 1.81 | 1.12 | 2.40 | 0.08 | 0.15 | 2.63 | 1.22 | 1.30 |
| 250 | 1.51 | 0.00 | 1.83 | 0.00 | 2.14 | 0.00 | 1.40 | 0.00 | 2.12 | 0.00 | 1.98 | 1.73 | 2.27 | 0.00 | 0.19 | 2.97 | 1.31 | 1.36 |
| 275 | 1.50 | 0.00 | 1.83 | 0.00 | 2.09 | 0.00 | 1.40 | 0.00 | 2.09 | 0.00 | 2.94 | 3.28 | 2.20 | 0.00 | 0.23 | 3.29 | 1.44 | 1.31 |
| 300 | 1.49 | 0.00 | 1.81 | 0.00 | 2.05 | 0.00 | 1.39 | 0.00 | 2.06 | 0.00 | 4.03 | 2.71 | 2.16 | 0.00 | 0.28 | 3.61 | 1.51 | 0.96 |
| 325 | 1.48 | 0.00 | 1.80 | 0.00 | 2.02 | 0.00 | 1.39 | 0.00 | 2.04 | 0.00 | 4.90 | 1.61 | 2.13 | 0.00 | 0.32 | 3.93 | 0.55 | 0.64 |
| 350 | 1.48 | 0.00 | 1.80 | 0.00 | 2.00 | 0.00 | 1.39 | 0.00 | 2.02 | 0.00 | 4.18 | 0.08 | 2.11 | 0.00 | 0.37 | 4.24 | 0.22 | 1.35 |
| 400 | 1.47 | 0.00 | 1.79 | 0.00 | 1.97 | 0.00 | 1.38 | 0.00 | 1.98 | 0.00 | 3.40 | 0.00 | 2.07 | 0.00 | 0.49 | 4.86 | 0.17 | 1.95 |
| 450 | 1.47 | 0.00 | 1.78 | 0.00 | 1.95 | 0.00 | 1.38 | 0.00 | 1.96 | 0.00 | 3.16 | 0.00 | 2.05 | 0.00 | 0.62 | 5.47 | 0.15 | 2.47 |
| 500 | 1.46 | 0.00 | 1.77 | 0.00 | 1.94 | 0.00 | 1.38 | 0.00 | 1.94 | 0.00 | 3.03 | 0.00 | 2.04 | 0.00 | 0.77 | 6.08 | 0.13 | 2.92 |
| 600 | 1.46 | 0.00 | 1.77 | 0.00 | 1.93 | 0.00 | 1.38 | 0.00 | 1.92 | 0.00 | 2.90 | 0.00 | 2.03 | 0.00 | 1.20 | 7.26 | 0.12 | 3.73 |
| 700 | 1.46 | 0.00 | 1.76 | 0.00 | 1.89 | 0.00 | 1.38 | 0.00 | 1.91 | 0.00 | 2.83 | 0.00 | 2.02 | 0.00 | 1.83 | 8.31 | 0.14 | 4.52 |
| 800 | 1.45 | 0.00 | 1.76 | 0.00 | 1.90 | 0.00 | 1.38 | 0.00 | 1.91 | 0.00 | 2.79 | 0.00 | 2.01 | 0.00 | 2.80 | 8.45 | 0.14 | 5.29 |
| 900 | 1.45 | 0.00 | 1.76 | 0.00 | 1.91 | 0.00 | 1.37 | 0.00 | 1.91 | 0.00 | 2.77 | 0.00 | 2.01 | 0.00 | 2.06 | 8.30 | 0.17 | 6.05 |
| 1000 | 1.45 | 0.00 | 1.76 | 0.00 | 1.92 | 0.00 | 1.37 | 0.00 | 1.90 | 0.00 | 2.75 | 0.00 | 2.00 | 0.00 | 1.35 | 9.58 | 0.21 | 6.76 |
| 1100 | 1.45 | 0.00 | 1.75 | 0.00 | 1.93 | 0.00 | 1.37 | 0.00 | 1.90 | 0.00 | 2.74 | 0.00 | 2.00 | 0.00 | 1.21 | 10.97 | 0.24 | 7.47 |

Fig. 3

(a) COATING STRUCTURE FOR λ=300nm OR LONGER WAVELENGTHS (b) TRANSMITTANCE CHARACTERISTIC

PHOTODIODE ARRAY FOR SPECTROMETRIC MEASUREMENTS AND SPECTROMETRIC MEASUREMENT SYSTEM

CROSS REFERENCE TO RELATED APPLICATIONS

This is a National Stage of International Application No. PCT/JP2013/058857 filed Mar. 26, 2013, claiming priority based on Japanese Patent Application No. 2012-072050 filed Mar. 27, 2012, the contents of all of which are incorporated herein by reference in their entirety.

TECHNICAL FIELD

The present invention relates to a photodiode array for spectrometric measurements for detecting light dispersed into wavelength components by a light-dispersing element, and a spectrometric measurement system using the photodiode array as a detector.

BACKGROUND ART

In a spectrometric measurement system, such as an ultraviolet-visible spectrophotometer or a spectrometric detector for a liquid chromatograph, a photodiode array detector consisting of a large number (e.g. 128 to 1024 pieces) of linearly arrayed photodiodes made of silicon (Si), indium gallium arsenide (InGaAs) or other semiconductor as the base material is used for simultaneous detection of light dispersed into wavelength components by a light-dispersing element (the "photodiode array detector" may also be called a "linear image sensor", as in Non Patent Literature 1). In the following description, the photodiode array is appropriately abbreviated as PDA.

Figure 10:
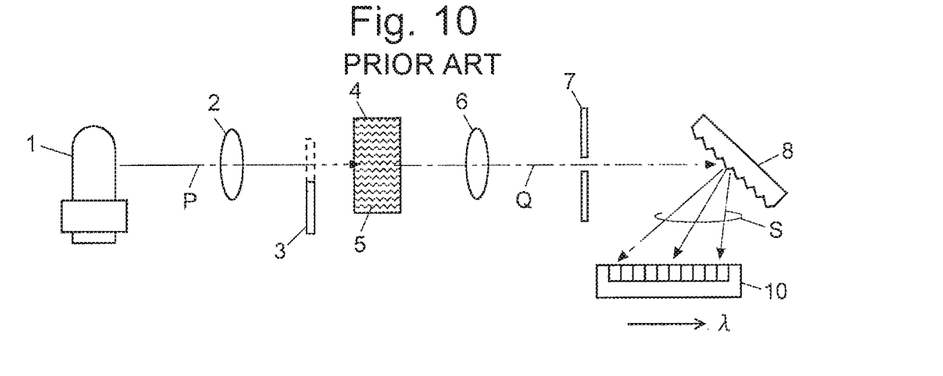
FIG. 10 is a schematic configuration diagram of a commonly used spectrophotometer using a PDA detector.

FIG. 10 is a schematic configuration diagram of a commonly used spectrophotometer using a PDA detector. A measurement light P generated from the emission point of a light source 1 having a predetermined emission spectrum is condensed by a lens 2 and cast into a sample cell 4 made of quartz glass or a similar transparent material in which a solution sample 5 is held. The transmitted light Q which has passed through the solution sample 5 is condensed by a lens 6 and falls onto a light-dispersing element 8, such as a diffraction grating, through a slit 7. The light-dispersing element 8 disperses the transmitted light Q into wavelength components in a one-dimensional direction, and the wavelength-dispersed light S reaches a PDA detector 10. Since the positional relationship between the light-dispersing element 8 and the PDA detector 10 is always the same, each photodiode constituting one picture element on the PDA detector 10 receives a ray of wavelength-dispersed light S with a fixed range of wavelengths at a fixed incident angle. Each photodiode of the PDA detector 10 produces a detection signal corresponding to the intensity (amount) of the incident light. A blank measurement with no incident light can be performed by blocking the measurement light P with a shutter 3 provided between the lens 2 and the sample cell 4. In the present example, the light-dispersing element 8 shown in FIG. 10 is a concave reflection grating, which is capable of forming an image of the slit 7 on the light-receiving surface of the PDA detector 10. In some cases, a lens, mirror or similar optical element having such an image-forming capability may be provided separately from the light-dispersing element 8.

The configuration shown in FIG. 10 is the basic configuration of an absorption spectrophotometer for detecting light transmitted through a sample. In some systems, such as an interferometric film-thickness meter or an emission spectrometer, the solution sample 5 may be replaced by a solid sample or gas sample, or no sample cell 4 holding such samples may be provided at all. The light detected with the PDA detector 10 is not always a ray of light transmitted through a sample; it may be a ray of light reflected or scattered by a sample or directly emitted from the sample. The light-dispersing element 8 is not always a reflection light-dispersing element; it may be a transmission light-dispersing element, such as a prism or a transmission grating. In any of these cases, the spatial arrangement of the components denoted by reference signs 6 through 10 in FIG. 10 is appropriately changed according to the direction of propagation of the transmitted light, reflected (scattered) light, emitted light or other kinds of light to be detected.

In the case of a commonly used ultraviolet-visible spectrophotometer, the required wavelength range is from 200 nm to 1100 nm, i.e. from ultraviolet through near-infrared wavelength regions. To achieve a high level of detection sensitivity in the aforementioned spectrophotometer, each photodiode in the PDA detector needs to have a high level of sensitivity to incident light having a specific wavelength or a wavelength range. For this purpose, it is important to coat the surface of each photodiode with a single-layer or multilayer dielectric coating as an antireflection coating so that incident light can efficiently reach the semiconductor region (photoelectric conversion region) in each photodiode while minimizing the loss of the incident light falling onto the photodiode. For a normally used single photodiode or a PDA consisting of a small number of photodiodes (e.g. a few to several channels), there have been many reports on antireflection coatings capable of allowing incident light to reach the semiconductor region with high efficiency over a limited wavelength range within the ultraviolet through near-infrared wavelength region. However, it is practically impossible to entirely cover the wavelength range from the ultraviolet through near-infrared wavelength region with only a single kind of antireflection coating.

In general, the term "antireflection" in a broad sense includes the function of reducing the surface reflectance by absorbing incident light in the coating layer. However, in the present description, the term "antireflection" is used in a limited sense and means the function of suppressing the reflection of incident light and allowing this light to efficiently reach the semiconductor region.

One example of the detector conventionally used in the previously described type of spectrometric measurement system is a PDA disclosed in Non Patent Literature 1. This type of conventional PDA consists of an array of photodiodes whose surfaces are entirely covered with a surface protection (passivation) coating made of silicon oxide ($SiO_2$), silicon nitride ($Si_3N_4$) and/or other semiconductor materials with a uniform thickness. Specifically, the PDA described in Non Patent Literature 1, which is sensitive to a broad range of wavelengths from 190 nm to 1100 nm, has a substrate made of silicon (Si) whose surface is entirely covered with a silicon oxide coating of approximately 1000 nm in thickness. The silicon oxide coating has a refractive index between those of silicon and air, and therefore, shows the effect of increasing the light transmittance by a certain amount. However, this effect of increasing the light transmittance is low within an ultraviolet wavelength region of 380 nm or shorter wavelengths where silicon has a large extinction coefficient (the imaginary part of the refractive index). Furthermore, in this PDA, a wavelength range with high light transmittance and a wavelength range with low light transmittance alternately appear due to the interference effect of the silicon oxide coating, which is reflected in the spectral sensitivity characteristic.

Figure 11:
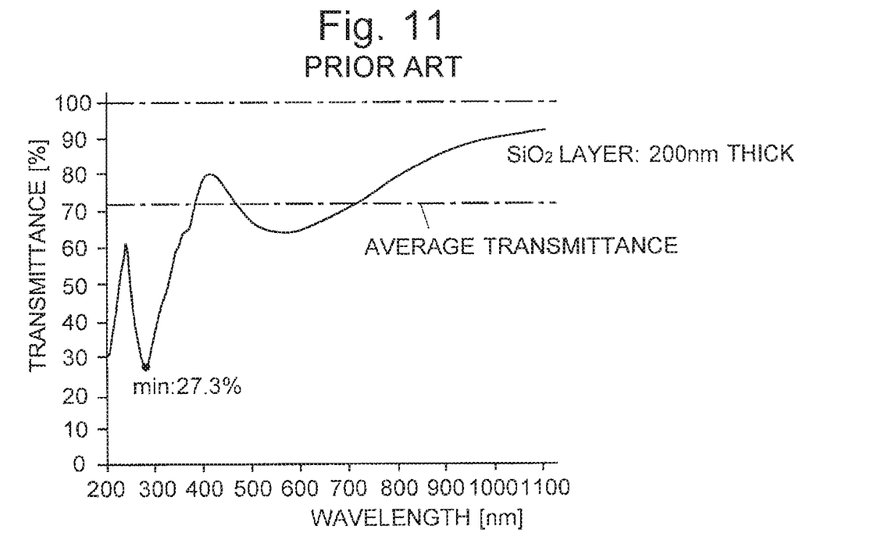
FIG. 11 shows one example of the transmittance characteristic of an antireflection coating used in a conventional PDA.

FIG. 11 is one example of the wavelength-transmittance characteristic of an antireflection coating used in a conventional PDA. The antireflection coating is a single-layer $SiO_2$ film with a thickness of 200 nm formed on a silicon substrate. The transmittance characteristic is comparatively flat within a range from visible through near-infrared wavelength regions, with the transmittance maintained at high levels of 60% or higher. By contrast, within a range of 350 nm or shorter wavelengths, there is a wavelength range where the transmittance noticeably decreases, and the fluctuation in the transmittance with respect to the wavelength is considerably large. Within such a wavelength range where the transmittance is extremely low, the detection sensitivity significantly decreases, so that the detection signals produced by those photodiodes which receive light within the aforementioned wavelength range have low signal-to-noise ratios.

The aforementioned large fluctuation in the transmittance due to the interference effect can be suppressed to some extent by using an appropriate multilayer dielectric coating in place of the single-layer $SiO_2$ coating. However, this technique cannot fundamentally solve the problem that the transmittance is extremely low at a portion of the photodiodes and prevents the generation of highly reliable detection signals from those photodiodes.

CITATION LIST

Non Patent Literature

Non Patent Literature 1: "NMOS linear image sensor S3901/S3904 series", Hamamatsu Photonics K. K., [searched on Jan. 17, 2012, the Internet

SUMMARY OF INVENTION

Technical Problem

The present invention has been developed in view of the previously described problem, and its primary objective is to provide a PDA for spectrometric measurements capable of detecting wavelength-dispersed light with high sensitivity over a broad range of wavelengths from ultraviolet through near-infrared wavelength regions. Another objective of the present invention is to provide a spectrometric measurement system capable of measuring absorbance, reflectance or other physical quantities with high sensitivity and high accuracy over a broad range of wavelengths from ultraviolet through near-infrared wavelength regions.

Solution to Problem

A photodiode array for spectrometric measurements according to the present invention aimed at solving the previously described problem is a photodiode array for spectrometric measurements having a plurality of photodiodes arrayed in a one-dimensional form, the photodiode array being arranged so that the array direction of the photodiodes is made to coincide with the wavelength-dispersing direction of a light-dispersing element so as to concurrently detect wavelength components of light dispersed by the light-dispersing element, wherein:

the photodiodes are divided into groups in such a manner that each group includes one or more photodiodes neighboring each other in the array direction, with at least one group including two or more photodiodes; and the groups are covered with an antireflection coating having a common transmittance characteristic for each group and having different transmittance characteristics between any two neighboring groups.

The antireflection coating having different characteristics for each group should preferably be designed so that the surfaces of all the photodiodes belonging to the group concerned have a transmittance characteristic showing a maximum transmittance within a wavelength range of light to be received by those photodiodes. However, provided that the transmittance characteristic of one group does not become extremely lower than those of the other groups, the transmittance characteristic of that group does not always need to have a maximum transmittance within the aforementioned wavelength range. Naturally, even in this case, the fluctuation in the transmittance with respect to the wavelength should be as small as possible.

That is to say, in the design phase of the photodiode array for spectrometric measurements according to the present invention, the wavelength of light to be introduced into each photodiode is determined from the optical arrangement of the photodiode array and the light-dispersing element inside the spectrometric measurement system in which the photodiode array is to be used. Based on the thus determined wavelengths, the photodiodes are divided into a plurality of mutually neighboring groups, and the surface of each group is covered with an antireflection coating suitable for the wavelength of light to be received by the group concerned. Specifically, the material and/or thickness of the antireflection coating on each group is adjusted so that the transmittance of the antireflection coating shows a maximum value within the wavelength range of light to be received by all the photodiodes belonging to that group and the minimum value of the transmittance of the antireflection coating within the aforementioned wavelength range becomes adequately high. As a rough standard, the minimum value of the transmittance of the antireflection coating within the aforementioned wavelength range should preferably be equal to or higher than 75% of the maximum transmittance within the same wavelength range.

In general, the incident angle at which the wavelength components of the light dispersed by a light-dispersing element fall onto a photodiode array changes depending on the position of the photodiode. Accordingly, when calculating the transmittance of the antireflection coating, it is desirable to calculate the incident angle of the principal ray of each light flux to be received by the corresponding photodiode as arranged in the optical configuration of the spectrometric measurement system, and to calculate the transmittance at each of the calculated incident angles, rather than the transmittance at normal incidence (i.e. at an incident angle of zero degrees).

Normally, silicon is used as the semiconductor base material of the photodiode array. The refractive index of silicon significantly changes within a range of 380 nm or shorter wavelengths, i.e. within the ultraviolet wavelength region. This change in the transmittance is particularly noticeable within a range of 300 nm or shorter wavelengths. Accordingly, in one preferable mode of the photodiode array for spectrometric measurements according to the present invention, the wavelength range of light to be measured includes at least an ultraviolet wavelength region and a visible wavelength region continuously connected to each other, the number of groups to which the photodiodes for receiving light of the ultraviolet wavelength region belong is greater than the number of groups to which the photodiodes for receiving light of the visible wavelength region belong, and the photodiodes for receiving light of 300 nm or shorter wavelengths are divided into three or more groups.

According to this configuration, the wavelength range where the refractive index of the silicon significantly changes is finely divided into small groups, so that high transmittance can be achieved for any incident light having a wavelength within that range. Meanwhile, the number of groups corresponding to the wavelength range where the refractive index of the silicon shows only a minor change is small, whereby the total number of groups is prevented from being unnecessarily large and making the manufacturing process of the antireflection coating complex.

In the photodiode array for spectrometric measurements according to the present invention, each coating layer constituting the antireflection coating of each group should preferably be made of a dielectric or metallic material having a low level of absorption loss within the wavelength range of light to be received by the group concerned. As a specific example, the substrate may preferably be made of silicon, while the material of each coating layer constituting the antireflection coating may preferably contain at least one material selected from the group of silicon oxide, aluminum oxide, silicon nitride, aluminum, yttrium oxide, magnesium fluoride, hafnium oxide, titanium oxide and silver.

Each coating layer constituting the antireflection coating should preferably be made of a material which can be deposited, etched and patterned by a standard process of manufacturing semiconductor integrated circuits. As a specific example, the substrate may preferably be made of silicon, while the material of each coating layer constituting the antireflection coating may preferably contain at least one material selected from the group of silicon oxide, aluminum oxide, silicon nitride and aluminum.

With this configuration, the antireflection coating can be produced without affecting the electrical characteristics of the semiconductor circuits of the photodiode. The configuration is also advantageous for cost reduction since there is no need to prepare special materials for the coating.

In the photodiode array for spectrometric measurements according to the present invention, the antireflection coating covering the photodiodes belonging to a plurality of groups may preferably include a coating layer whose material and thickness are common to the groups. As a specific example, the antireflection coating may commonly include a silicon oxide layer in contact with a surface of silicon substrate and a coating layer of a dielectric material subsequently formed on the silicon oxide layer and having a refractive index whose real part is greater than that of silicon oxide, or alternatively, it may commonly include a coating layer of silicon oxide in contact with a surface of silicon substrate and a coating layer of a metallic material subsequently formed on the coating layer of silicon oxide.

This configuration makes it possible to simplify the manufacturing process and reduce the production cost.

A spectrometric measurement system according to the present invention aimed at solving the previously described problem is a spectrometric measurement system in which the photodiode array for spectrometric measurements according to the present invention is used as a detector, wherein a light-dispersing element and the photodiode array for spectrometric measurements are arranged so that the array direction of the photodiodes coincides with the dispersing direction of wavelength components of light dispersed by the light-dispersing element.

Advantageous Effects of the Invention

With the photodiode array for spectrometric measurements according to the present invention, it is possible to realize the state in which any of the photodiodes for receiving rays of light having a broad range of different wavelengths (e.g. from ultraviolet through near-infrared wavelength regions) is covered with an antireflection coating which allows the transmission of light with high efficiency. In particular, an adequately high level of transmittance can be achieved even within the ultraviolet wavelength region where, if a conventional photodiode array is used, the sensitivity will be noticeably low due to the low transmittance of the incident light. Therefore, the situation in which the detection sensitivity is extremely low at some wavelengths does not occur, so that a highly reliable spectrometric measurement can be made.

With the spectrometric measurement system according to the present invention, it is possible to measure absorbance, reflectance or other physical quantities with high sensitivity and high accuracy over a broad range of wavelengths, e.g. from ultraviolet through near-infrared wavelength regions.

DESCRIPTION OF EMBODIMENTS

One embodiment of the photodiode array (PDA) for spectrometric measurements according to the present invention is hereinafter described with reference to the attached drawings. The PDA of the present embodiment is designed to be used as a detector in a spectrophotometer as shown in FIG. 10. That is to say, each of the photodiodes constituting the PDA receives a predetermined wavelength of light. The wavelength range of light to be received by the entire PDA is from 200 nm to 1100 nm.

Figure 1:
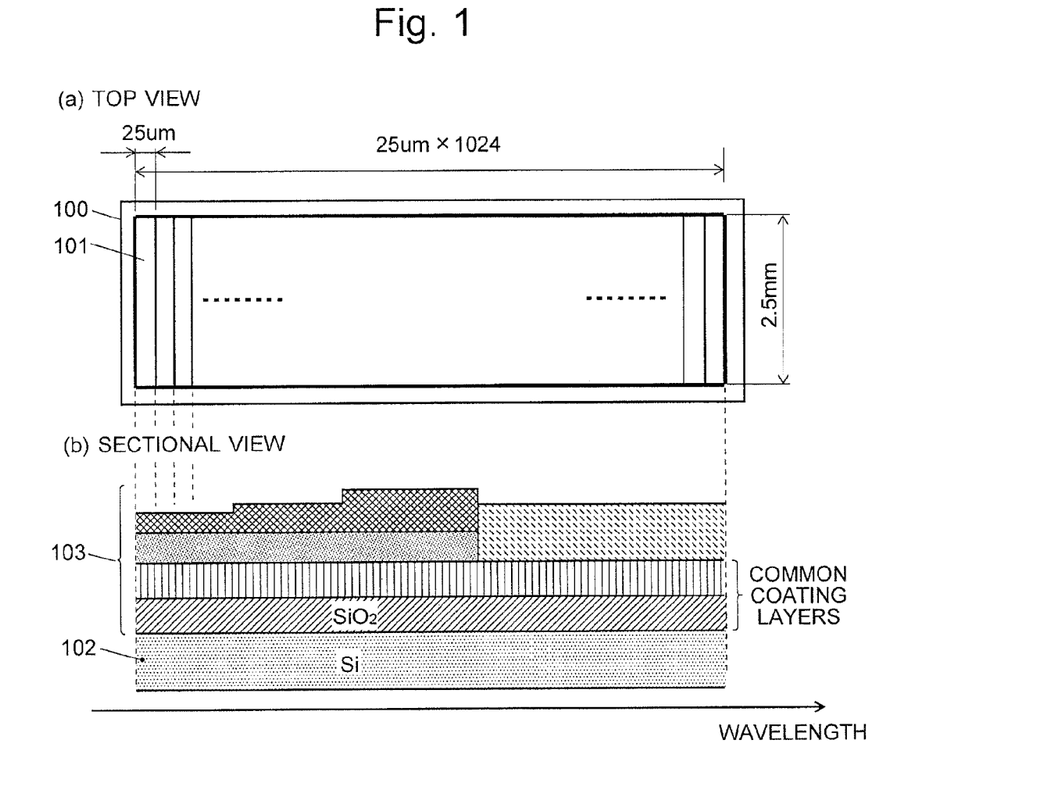
FIG. 1 is a top view (a) and a vertical sectional view (b) of a PDA as one embodiment of the present invention.

FIG. 1 is a top view (a) and a vertical sectional view (b) of the PDA 100 of the present embodiment. The PDA 100 has 1024 pieces of photodiodes 101 linearly arrayed as shown in diagram (a) in FIG. 1. Each photodiode has an elongated light-receiving surface having a width of 25 μm and a length of 2500 μm, with its longer sides being in contact with those of the neighboring photodiodes. In FIG. 1, the wavelength of the incident light increases from left to right: the leftmost photodiode receives ultraviolet light having wavelengths near 200 nm, while the rightmost photodiode receives near-infrared light having wavelengths near 1100 nm.

As shown in diagram (b) in FIG. 1, an antireflection coating 103 is formed on the surface of a silicon substrate 102 in which photoelectric conversion regions (not shown) are to be formed. This coating 103 consists of a plurality of coating layers. The materials, thicknesses, order and other factors relating to the coating layers are selected or determined so that the optical equivalent complex admittance of the substrate 102 and the antireflection coating 103 as viewed from the incident side (air side) as a whole will be close to one. In the present embodiment, the materials and thicknesses of the first and second coating layers from below (i.e. from the substrate 102) are common to all the photodiodes 101, while the third and subsequent coating layers have their materials and thicknesses varied according to the wavelength of the light to be received.

Figure 2:
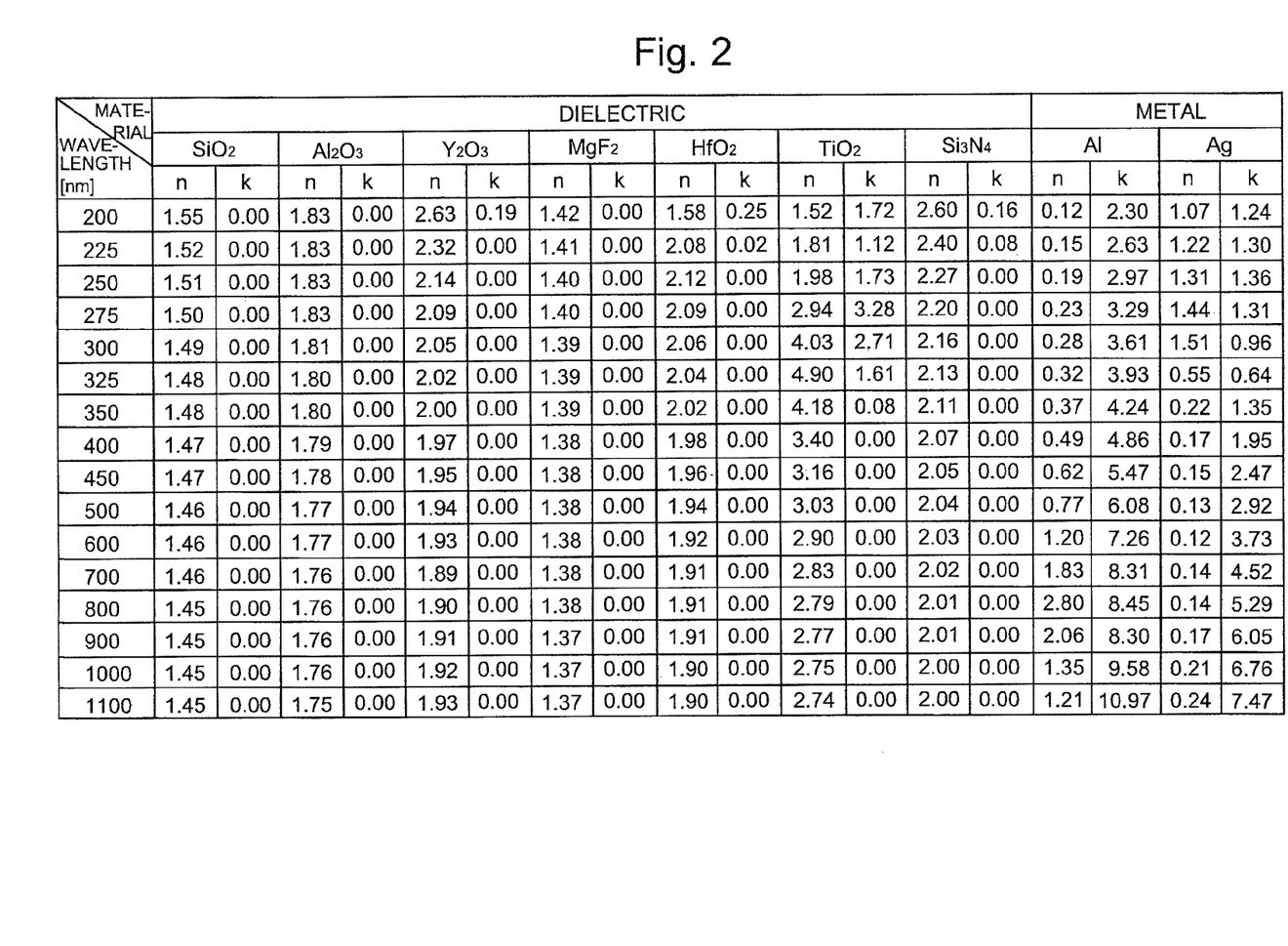
FIG. 2 shows the refractive indices of material candidates of the coating layers constituting an antireflection coating.

FIG. 2 shows the values of refractive index (n+ik) of major candidates of the dielectric and metallic materials for creating the coating layers constituting the antireflection coating 103.

A suitable choice for the dielectric material is a material having a refractive index whose imaginary part (extinction coefficient) k is equal or close to zero. For example, silicon oxide ($SiO_2$) and aluminum oxide ($Al_2O_3$) are suitable as a coating-layer material of the antireflection coating over a wavelength range from 200 nm to 1100 nm. By contrast, titanium oxide ($TiO_2$), which is also a dielectric material, has a large value of extinction coefficient k at 350 nm or shorter wavelengths, and therefore, its use should be limited to a wavelength range longer than 350 nm. Silicon nitride ($Si_3N_4$) has a large value of extinction coefficient k at wavelengths near 200 nm and its use should be limited to a wavelength range longer than 200 nm.

A suitable choice for the metallic material is a material having a refractive index whose real part n is as small as possible compared to the imaginary part k. As a rough standard, it should preferably be equal to or less than 10% of the imaginary part k. For example, silver (Ag) is a suitable material for a wavelength range from 400 nm to 1100 nm, while aluminum (Al) is a suitable material for a wavelength range from 200 nm to 400 nm.

The refractive indices of the materials shown in FIG. 2 are the values obtained when the coating layers are created under typical film-forming conditions. Under different film-forming conditions, the values may possibly be different from those shown in FIG. 2. Evidently, in such a case, the wavelength range within which each material can be suitably used as the material for the coating layers of the antireflection coating will be different from the wavelength range mentioned in the previously described example.

An important factor other than the aforementioned optical properties to be naturally considered in selecting the materials is the presence of an established technique (deposition and patterning techniques) for forming a coating layer which is chemically and electrically stable during the manufacturing process of the photodiode array as well as during a long-term use. From this viewpoint, it is preferable to form the coating layers of the antireflection coating from materials which have been practically used in standard processes for producing semiconductor devices using silicon as the main material. Examples of the materials commonly used in the current standard process of producing semiconductor devices are silicon oxide, aluminum oxide, silicon nitride ($Si_3N_4$), and aluminum. The antireflection coating of the PDA according to the present embodiment consists of a combination of the three dielectric materials included in those examples.

It should be noted that any of the other material candidates shown in FIG. 2 (yttrium oxide, magnesium fluoride, hafnium oxide, titanium oxide and silver) can naturally be used in addition to or in place of a portion of the aforementioned combination.

Figure 3:
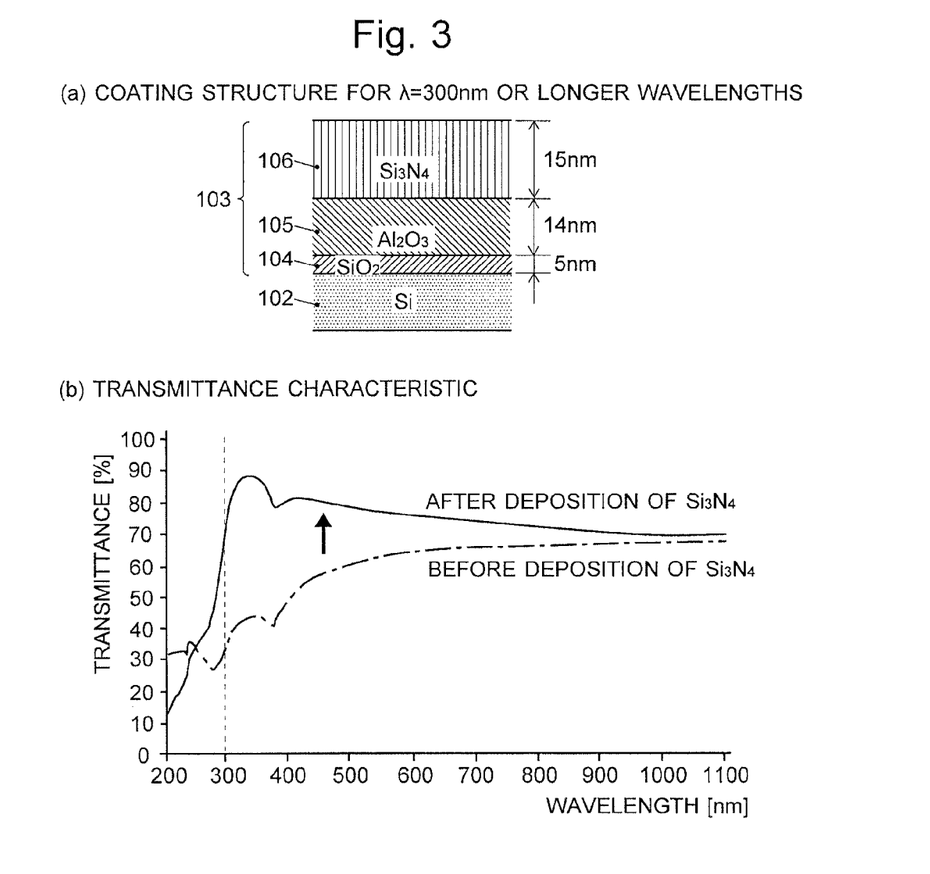
FIG. 3 shows the structure (a) and the transmittance characteristic (b) of the antireflection coating which covers photodiodes for receiving light over a wavelength range from 300 nm to 1100 nm in the PDA of the present embodiment.

Diagram (a) in FIG. 3 shows one example of the coating structure of the antireflection coating 103 with which a transmittance of 70% or higher can be achieved over a wavelength range from 300 nm to 1100 nm. The antireflection coating 103 has three coating layers: a silicon oxide coating layer 104 with a thickness of 5 nm formed on the silicon substrate 102, an aluminum oxide coating layer 105 with a thickness of 14 nm, and a silicon nitride coating layer 106 with a thickness of 15 nm. In the PDA of the present embodiment, an antireflection coating 103 having the structure as shown in diagram (a) in FIG. 3 is formed on the surface of the photodiodes having element numbers #114 through #1024, where the element numbers are assigned within the wavelength range from 200 nm to 1100 nm in such a manner that the photodiode to which the shortest wavelength is assigned has element number #1 and the photodiode to which the longest wavelength is assigned has element number #1024. That is to say, in the PDA of the present embodiment, all the photodiodes having element numbers greater than #114 (or the photodiodes which receive light having wavelengths longer than that of the light received by the photodiode #114) have the same structure of the antireflection coating 103 and can be regarded as belonging to one group.

Graph (b) in FIG. 3 shows a comparison between the transmittance characteristic of the coating structure shown in diagram (a) in FIG. 3 and that of the same structure without the silicon nitride coating layer 106. This graph demonstrates that the silicon nitride coating layer 106 is particularly effective for improving the transmittance at shorter wavelengths within the visible wavelength region.

On the other hand, within the wavelength range from 200 nm to 300 nm, if an antireflection coating having one specific kind of coating structure is used, the transmittance significantly changes with a change in the wavelength and it is difficult to entirely cover the ultraviolet wavelength region. To address this problem, in the PDA of the present embodiment, the 113 pieces of photodiodes having element numbers #1 to #113 are divided into five groups each of which includes approximately 20 photodiodes, and a different coating structure of the antireflection coating is used for each group.

Figure 4:
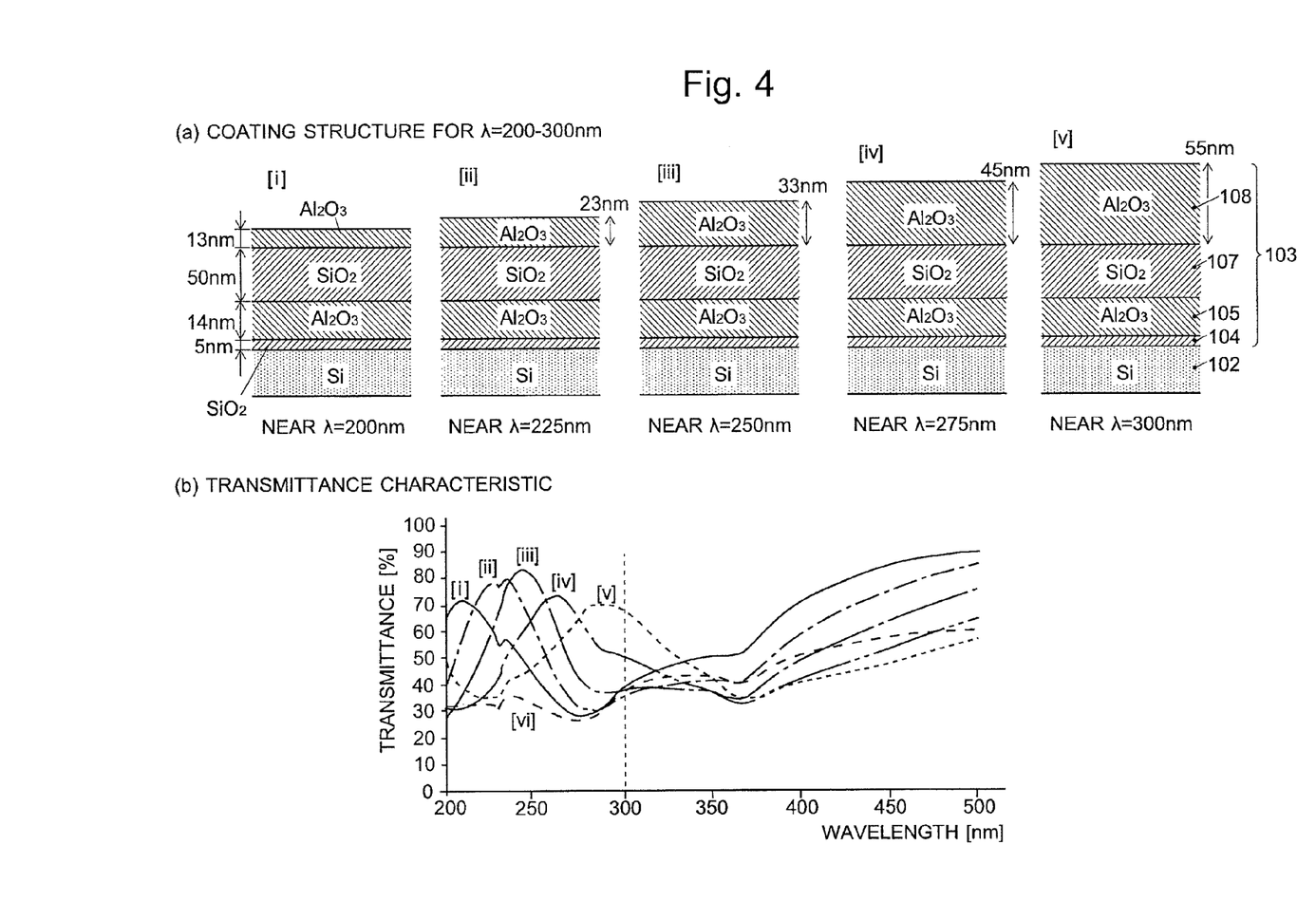
FIG. 4 shows the structure (a) and the transmittance characteristic (b) of the antireflection coating which covers photodiodes for receiving light over a wavelength range from 200 nm to 300 nm in the PDA of the present embodiment.

Diagram (a) in FIG. 4 shows the coating structure of the antireflection coating 103 within the wavelength range from 200 nm to 300 nm in the PDA of the present embodiment. The antireflection coating 103 is formed on the silicon substrate 102 by sequentially depositing the silicon oxide coating layer 104 with a thickness of 5 nm, the aluminum oxide coating layer 105 with a thickness of 14 nm and the silicon oxide coating layer 107 with a thickness of 50 nm, on top of which an aluminum oxide coating layer 108 is additionally formed, whose thickness is changed for each group taking into account the difference in the wavelength range of the incident light. The thickness of the uppermost aluminum oxide coating layer 108 is 13 nm for the first group ([i] in diagram (a) in FIG. 4) which corresponds to a wavelength range near $\lambda=200$ nm, 23 nm for the second group ([ii] in diagram (a) in FIG. 4) which corresponds to a wavelength range near $\lambda=25$ nm, 33 nm for the third group ([iii] in diagram (a) in FIG. 4) which corresponds to a wavelength range near $\lambda=250$ nm, 45 nm for the fourth group ([iv] in diagram (a) in FIG. 4) which corresponds to a wavelength range near $\lambda=275$ nm, and 55 nm for the fifth group ([v] in diagram (a) in FIG. 4) which corresponds to a wavelength range near $\lambda=300$ nm. Thus, the thickness of the aluminum oxide coating layer 108 is increased stepwise from shorter to longer wavelengths. It should be noted that the silicon oxide coating layer 104 and the aluminum oxide coating layer 105, which are the two layers initially formed on the silicon substrate 102, are common to all the photodiodes in terms of both the kind of material and the thickness, and therefore, can be simultaneously formed for all the photodiodes in the manufacturing process of the semiconductor device.

Graph (b) in FIG. 4 shows the transmittance characteristic of each coating layer shown in diagram (a) in FIG. 4. The curves denoted by reference signs [i]-[v] in graph (b) in FIG. 4 represent the transmittance characteristics of the antireflection coatings of the groups denoted by reference signs [i]-[v] in diagram (a) in FIG. 4, respectively. The curve denoted by reference sign [vi] in graph (b) in FIG. 4 represents the transmittance characteristic of the antireflection coating shown in diagram (a) in FIG. 3. As demonstrated by diagram (a) and graph (b) in FIG. 4, each single coating structure (i.e. each antireflection coating with one specific thickness of the aluminum oxide coating layer 108) has a considerably narrow peak of transmittance within the wavelength range from 200 nm to 300 nm. However, the wavelength at which the transmittance is maximized can be gradually shifted by changing the thickness of the aluminum oxide coating layer 108. In the present embodiment, this thickness is adjusted so that each of the five aforementioned groups has, within the wavelength range assigned to it, a wavelength at which the transmittance peak is maximized. According to this design, an envelope of the transmittance peaks of the five different coating structures shown in diagram (a) in FIG. 4 can be regarded as representing the transmittance characteristic of the antireflection coating 103 of the PDA of the present embodiment within the wavelength range from 200 nm to 300 nm.

Figure 5:
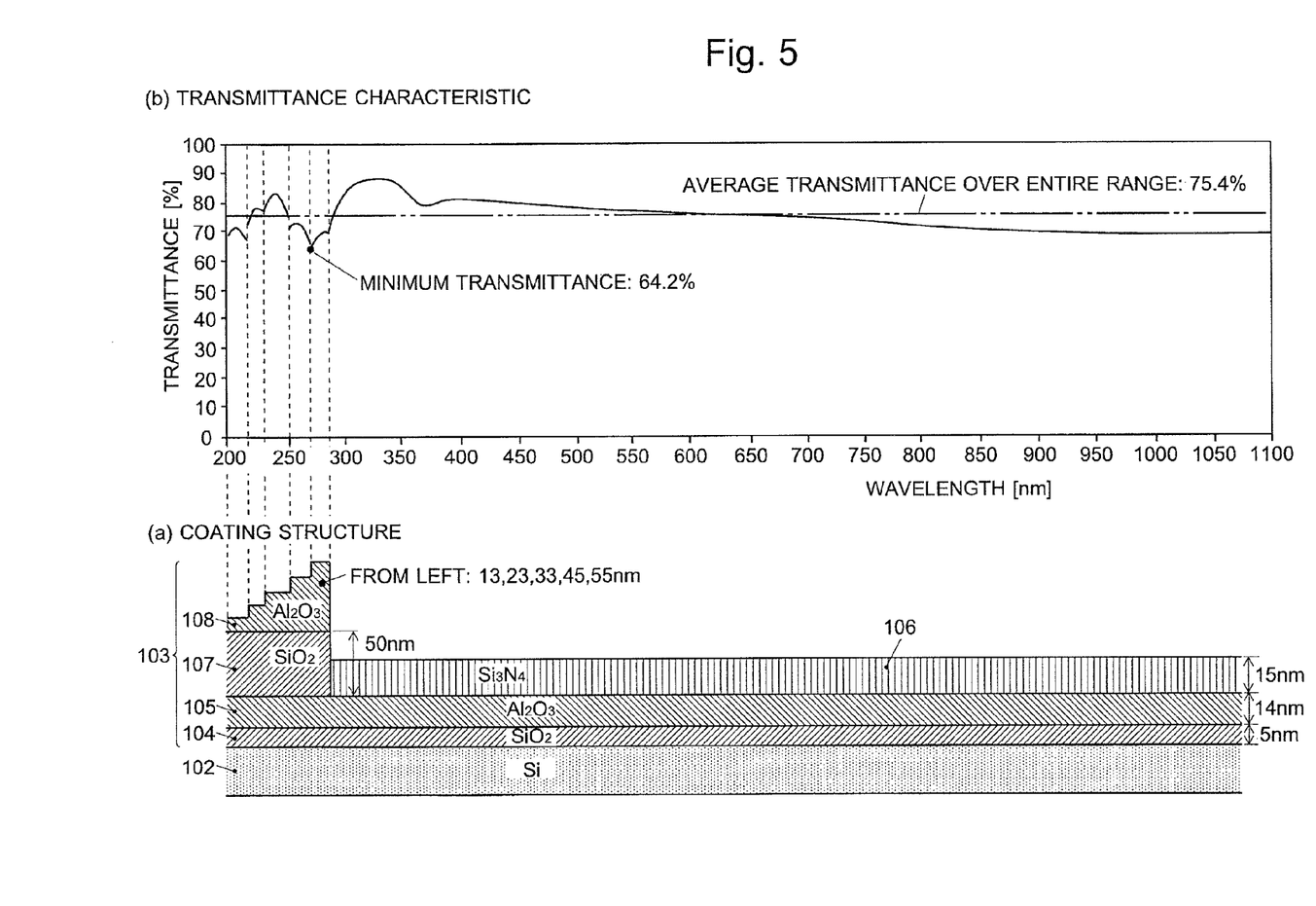
FIG. 5 shows the structure (a) and the transmittance characteristic (b) of the antireflection coating for ultraviolet through near-infrared wavelength regions in the PDA of the present embodiment.

FIG. 5 shows the coating structure (a) and the transmittance characteristic (b) of the antireflection coating 103 for the entire wavelength range to be measured (from 200 nm to 1100 nm). In the present example, the average transmittance over the entire wavelength range is 75.4% and the minimum transmittance is 64.2%. This result particularly demonstrates that the improvement in the minimum transmittance is noticeable as compared to the conventional antireflection coating consisting of a monolithic layer of silicon oxide shown in FIG. 11. Therefore, the present device can produce detection signals with high sensitivity for any incident light (the transmitted light S in FIG. 10), without omission, within a broad wavelength range from ultraviolet through near-infrared regions.

Figure 6:
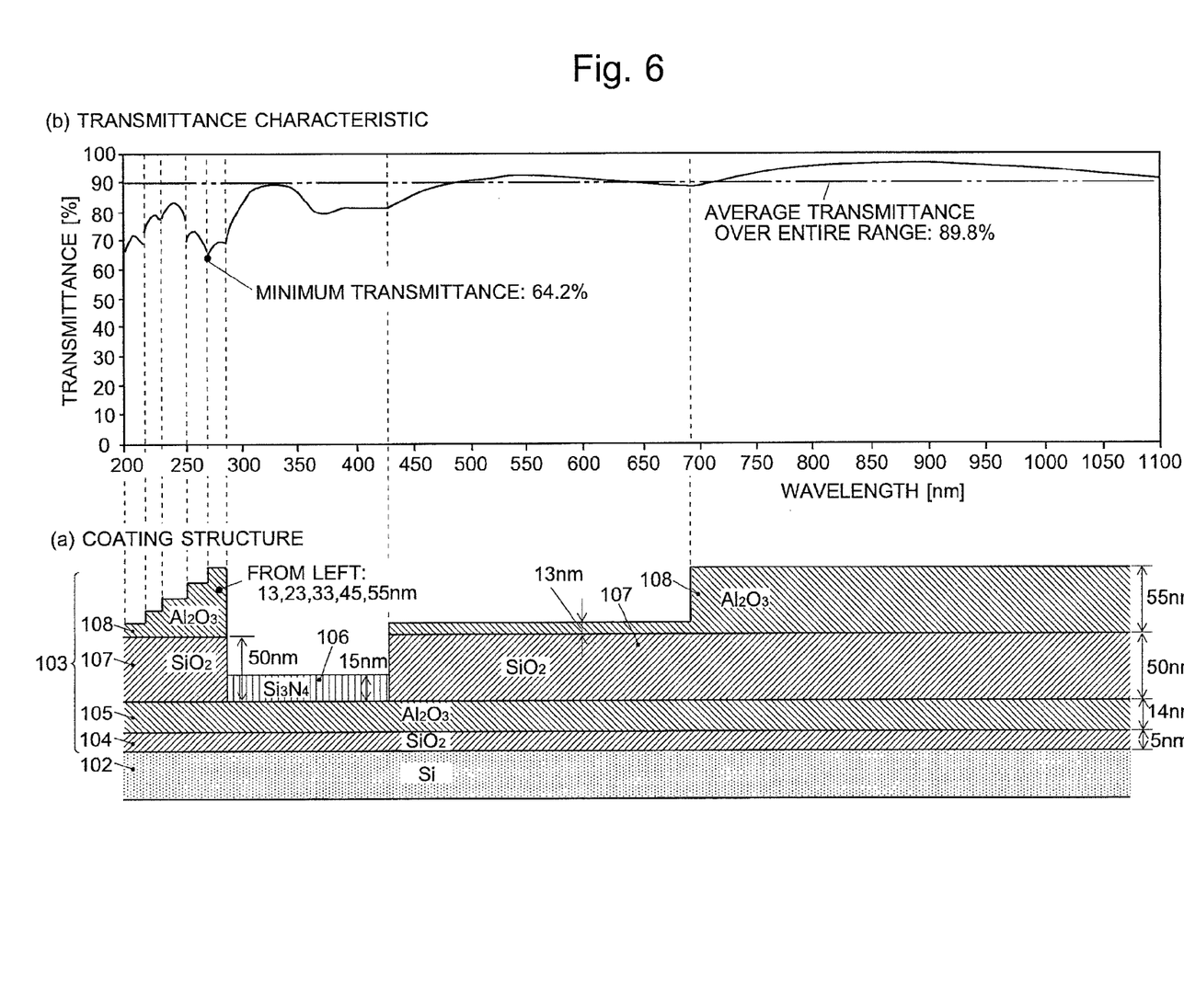
FIG. 6 shows the structure (a) and the transmittance characteristic (b) of the antireflection coating for ultraviolet through near-infrared wavelength regions in a PDA as the second embodiment of the present invention.

FIG. 6 shows the coating structure (a) and the transmittance characteristic (b) of the antireflection coating in the PDA of the second embodiment of the present invention. In the second embodiment, the structure of the antireflection coating 103 within a wavelength range shorter than 430 nm is identical to that of the first embodiment shown in FIG. 5 (in terms of the material and thickness of each coating layer). One feature of the second embodiment is that the coating structure of the antireflection coating 103 of the group corresponding to the wavelength range from 430 nm to 690 nm is identical to that of the antireflection coating corresponding to the first group in the ultraviolet wavelength region (near 200 nm). Another feature is that the coating structure of the antireflection coating 103 of the group corresponding to the wavelength range from 690 nm to 1100 nm is identical to that of the antireflection coating corresponding to the fifth group in the ultraviolet wavelength region (near 300 nm). With such a structure, a better transmittance characteristic than the first embodiment shown in FIG. 5 is achieved within the wavelength range equal to or longer than 430 nm.

As in the present example, the plurality of groups formed by dividing all the photodiodes in the PDA according to the present invention may include two or more groups which do not lie next to each other in the wavelength direction and in which an antireflection coating having the same coating structure is used to cover the photodiodes.

Figure 7:
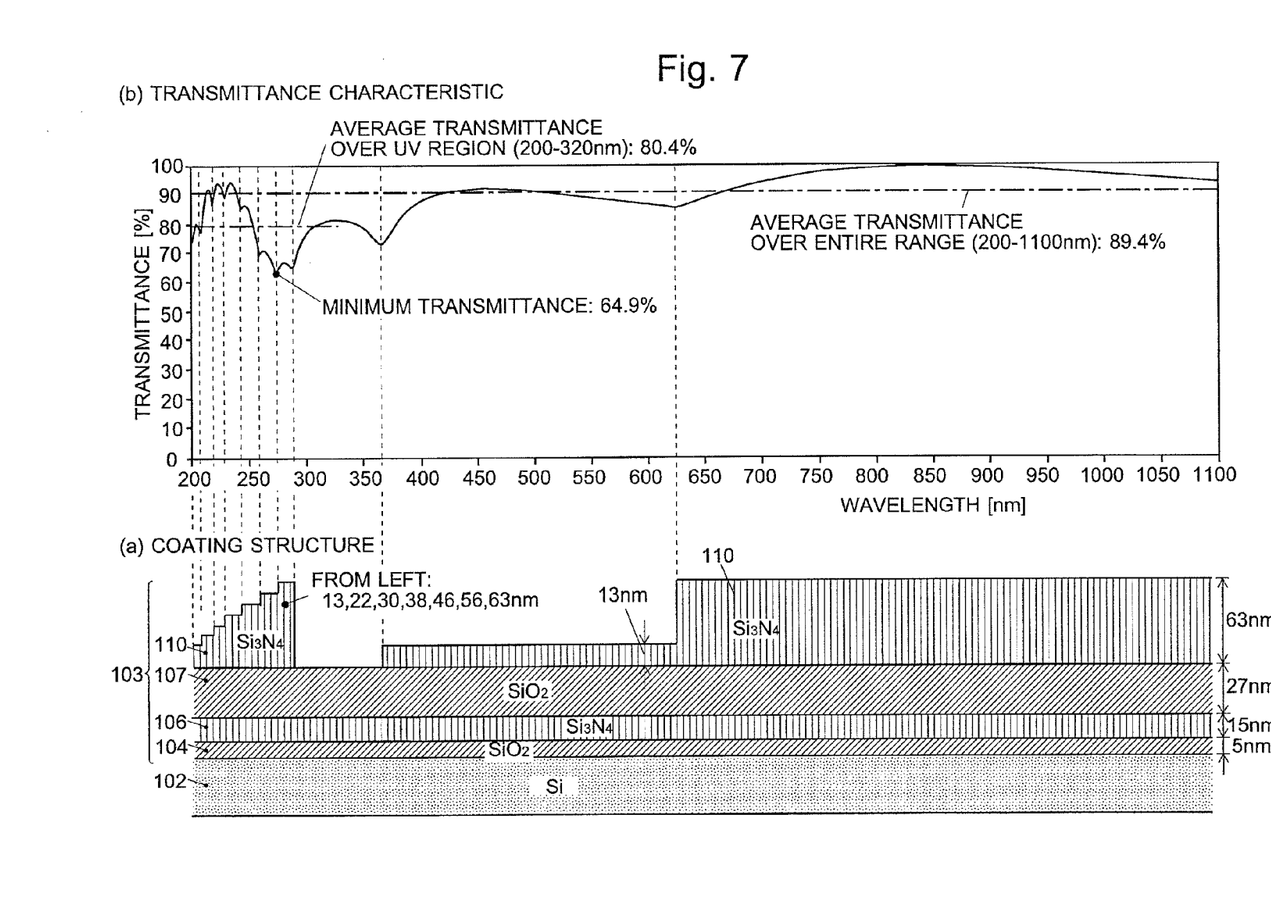
FIG. 7 shows the structure (a) and the transmittance characteristic (b) of the antireflection coating for ultraviolet through near-infrared wavelength regions in a PDA as the third embodiment of the present invention.

FIG. 7 shows the coating structure (a) and the transmittance characteristic (b) of the antireflection coating in the PDA of the third embodiment of the present invention. The third embodiment is a variation of the PDA of the second embodiment, in which the aluminum oxide coating layers 105 and 108 constituting the antireflection coating 103 are respectively replaced with silicon nitride coating layers 106 and 110. As compared to the second embodiment, the number of groups into which the photodiodes for receiving light within the ultraviolet wavelength region are divided is increased by two. Furthermore, with the change in the materials of the coating layers, the thicknesses of the coating layers are also changed so as to maximize the transmittance of the antireflection coating.

It should be noted that the silicon nitride coating layers 106 and 110 in the present embodiment is manufactured by a film-forming method different from the method used for the silicon nitride whose refractive index value is shown in FIG. 2. It has an adequately small value of extinction coefficient k within the wavelength ranges near 200 nm and 225 nm, and therefore, can be used as the material of the coating layers of the antireflection coating within those wavelength ranges.

Figure 8:
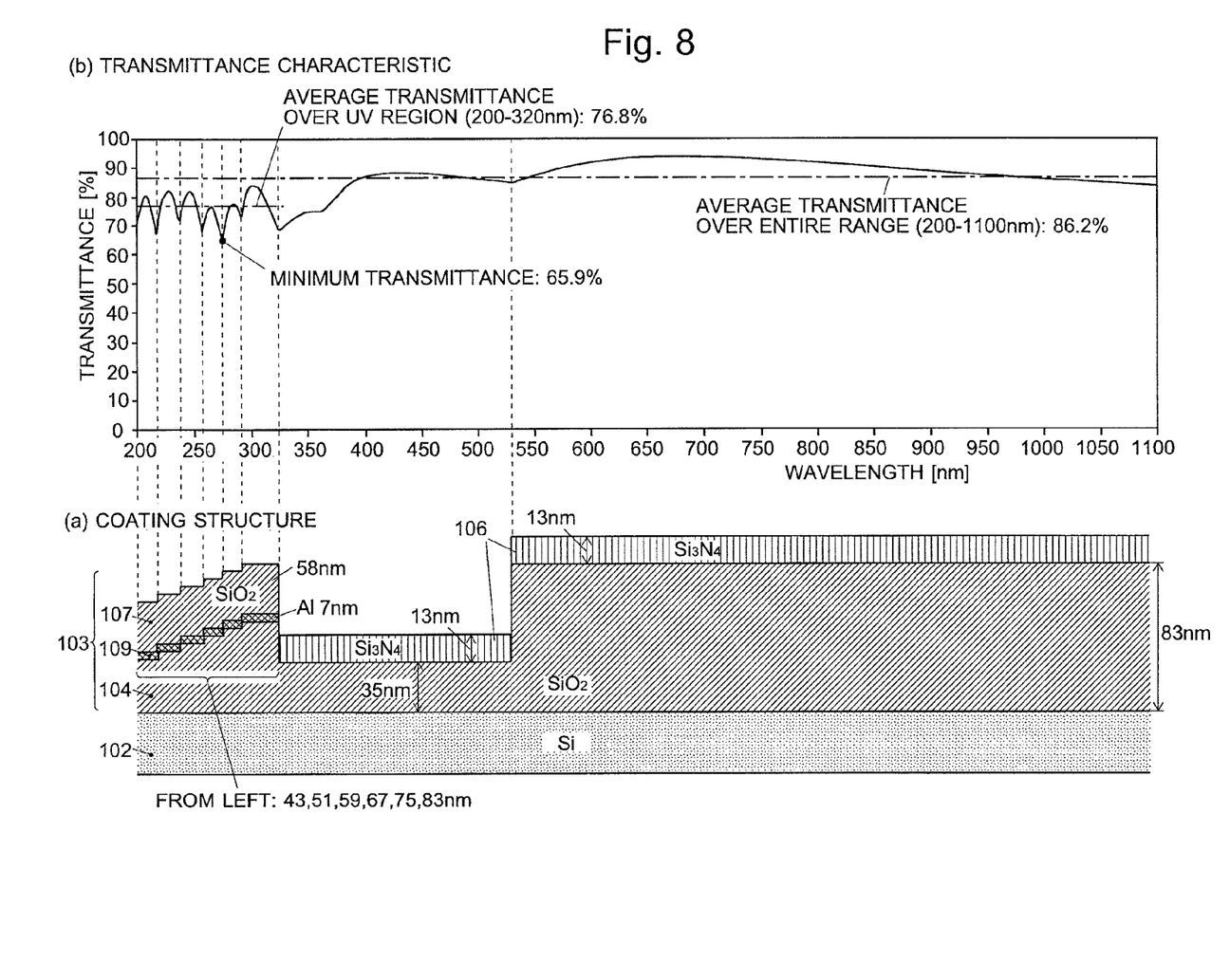
FIG. 8 shows the structure (a) and the transmittance characteristic (b) of the antireflection coating for ultraviolet through near-infrared wavelength regions in a PDA as the fourth embodiment of the present invention.

FIG. 8 shows the coating structure (a) and the transmittance characteristic (b) of the antireflection coating in the PDA of the fourth embodiment, which is different from the three previously described embodiments. In the present embodiment, a metallic coating layer 109 made of aluminum is introduced as one of the coating layers constituting the antireflection coating 103 within the ultraviolet wavelength region.

In the fourth embodiment, the photodiodes which receive light within a wavelength range from 200 nm to 320 nm are divided into six groups. The antireflection coating 103 for these groups is formed on the silicon substrate 102 by sequentially depositing a silicon oxide coating layer 104 having a different thickness for each group within a range from 43 nm to 83 nm, an aluminum coating layer 109 with a thickness of 7 nm, and a silicon oxide coating layer 107 with a thickness of 58 nm. The transmittance characteristic of the antireflection coating realized in the fourth embodiment is slightly inferior to that of the third embodiment yet approximately comparable to those of the first and second embodiments.

Figure 9:
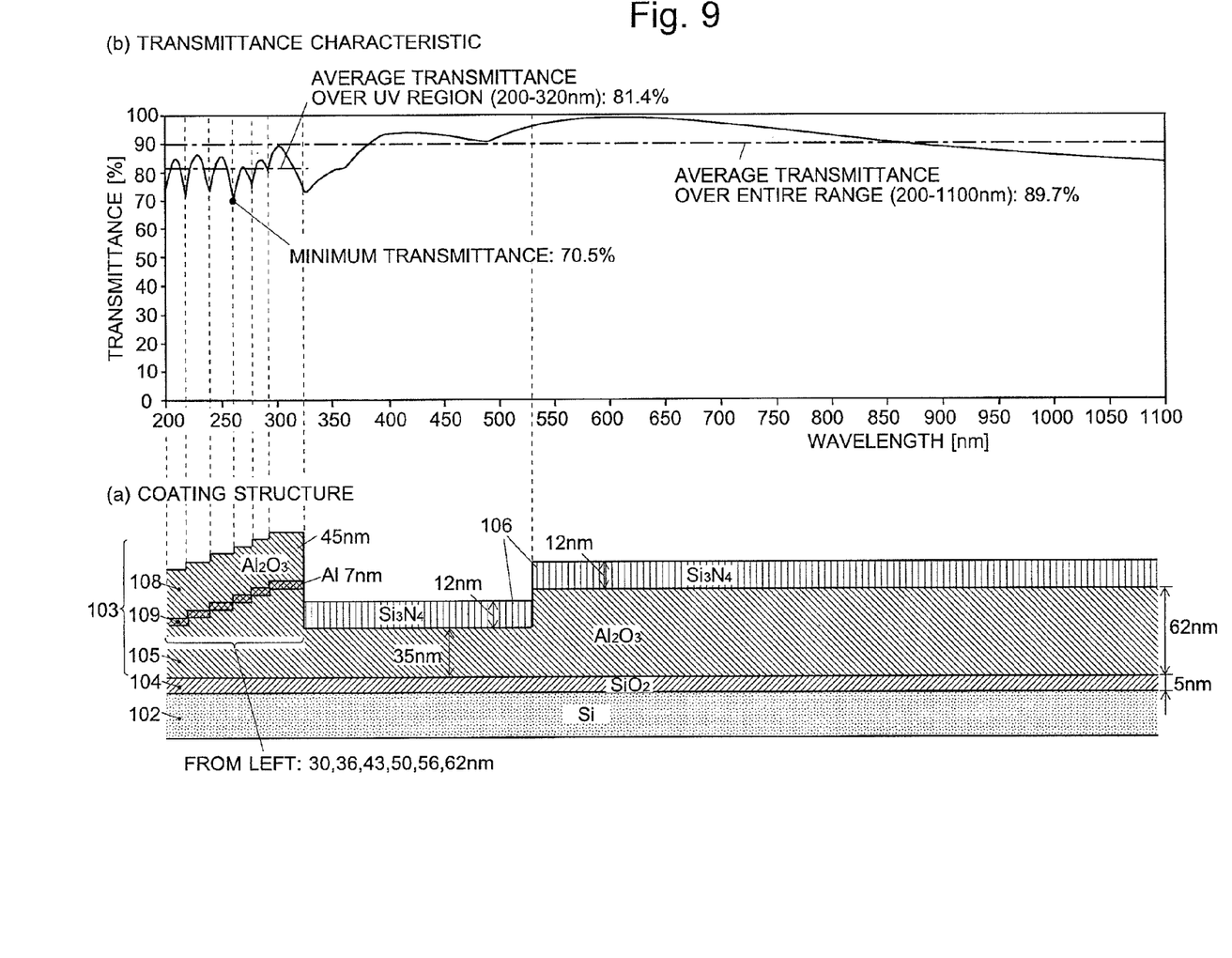
FIG. 9 shows the structure (a) and the transmittance characteristic (b) of the antireflection coating for ultraviolet through near-infrared wavelength regions in a PDA as the fifth embodiment of the present invention.

FIG. 9 shows the coating structure (a) and the transmittance characteristic (b) of the antireflection coating in the PDA of the fifth embodiment, which is a variation of the fourth embodiment. The difference from the PDA of the fourth embodiment exists in that the lower silicon oxide coating layer 104 in the antireflection coating 103 is replaced with a laminate of a thinner silicon oxide coating layer 104 and an aluminum oxide coating layer 105, and furthermore, the upper silicon oxide coating layer 107 is replaced with an aluminum oxide coating layer 108. With the change in the materials of the coating layers, the thicknesses of the coating layers are also changed so as to maximize the transmittance of the antireflection coating.

In the fifth embodiment, the wavelength range from 200 nm to 320 nm is divided into six groups. The antireflection coating for these groups is formed on the silicon substrate by sequentially depositing a silicon oxide coating layer with a thickness of 5 nm, an aluminum oxide coating layer having a different thickness for each group within a range from 30 nm to 62 nm, an aluminum coating layer with a thickness of 7 nm, and an aluminum oxide coating layer with a thickness of 45 nm. The antireflection coating 103 in the PDA of the fifth embodiment has an average transmittance of 89.7% over the entire wavelength range. The average transmittance within the wavelength range from 200 nm 320 nm is 81.4%. Thus, an antireflection coating whose transmittance characteristic is better than the fourth embodiment and comparable to that of the third embodiment can be realized.

It should be noted that the previous embodiments are mere examples of the present invention, and any changes, modification or addition appropriately made within the spirit of the present invention will evidently fall within the scope of claims of the present patent application.

That is to say, as already described, the materials of the coating layers constituting the antireflection coating can be changed in various ways, including the previously described examples. The thicknesses of those layers can also be appropriately changed. The boundary wavelengths at which the entire wavelength range to be measured is divided into groups in the previous embodiments are mere examples and can be arbitrarily changed. However, it should be noted that the ultraviolet wavelength region normally requires a finer pattern of grouping than the visible or near-infrared wavelength region and will inevitably have a greater number of groups per the same wavelength interval.

REFERENCE SIGNS LIST

1 . . . Light Source
2, 6 . . . Lens
3 . . . Shutter
4 . . . Sample Cell
5 . . . Solution Sample
7 . . . Slit
8 . . . Light-Dispersing Element
10 . . . Photodiode Array (PDA) Detector
100 . . . Photodiode Array (PDA)
101 . . . Photodiode
102 . . . Silicon Substrate
103 . . . Antireflection Coating
104, 107 . . . Silicon Oxide Coating Layer
105, 108 . . . Aluminum Oxide Coating Layer
106, 110 . . . Silicon Nitride Coating Layer
109 . . . Aluminum Coating Layer

The invention claimed is:

1. A photodiode array for spectrometric measurements having a plurality of photodiodes arrayed in a one-dimensional form, the photodiode array being arranged so that an array direction of the photodiodes is made to coincide with a wavelength-dispersing direction of a light-dispersing element so as to concurrently detect wavelength components of light dispersed by the light-dispersing element, wherein:
   the photodiodes are divided into groups in such a manner that each group includes one or more photodiodes neighboring each other in the array direction, with at least one group including two or more photodiodes; and
   the groups are covered with an antireflection coating having a common transmittance characteristic for each group, and being composed of a material different from a neighboring group or having a thickness different from a neighboring group.

2. The photodiode array for spectrometric measurements according to claim 1, wherein:
   the antireflection coating having different characteristics for each group is designed so that surfaces of all the photodiodes belonging to the group concerned have a transmittance characteristic showing a maximum transmittance within a wavelength range of light to be received by those photodiodes.

3. The photodiode array for spectrometric measurements according to claim 1, wherein:
   a wavelength range of light to be measured includes at least an ultraviolet wavelength region and a visible wavelength region continuously connected to each other, a number of groups to which the photodiodes for receiving light of the ultraviolet wavelength region belong is greater than a number of groups to which the photodiodes for receiving light of the visible wavelength region belong, and the photodiodes for receiving the light of the ultraviolet wavelength region are divided into three or more groups.

4. The photodiode array for spectrometric measurements according to claim 1, wherein:
   a minimum value of the transmittance of the antireflection coating covering the surfaces of the photodiodes belonging to each group is equal to or higher than 75% of a maximum value of the transmittance within a wavelength range of light to be received by all the photodiodes belonging to the group concerned.

5. The photodiode array for spectrometric measurements according to claim 1, wherein:
   the substrate in which the photodiodes are formed is made of silicon, while a material of each coating layer constituting the antireflection coating contains at least one material selected from a group of silicon oxide, aluminum oxide, silicon nitride, aluminum, yttrium oxide, magnesium fluoride, hafnium oxide, titanium oxide and silver.

6. The photodiode array for spectrometric measurements according to claim 1, wherein:
   the antireflection coating covering the photodiodes belonging to a plurality of groups includes a coating layer whose material and thickness are common to the groups.

7. The photodiode array for spectrometric measurements according to claim 6, wherein:
   the antireflection coating includes at least one coating layer made of one material and having a varied thickness, in addition to the coating layer whose material and thickness are common to the groups.

8. The photodiode array for spectrometric measurements according to claim 6, wherein:
   the antireflection coating commonly includes a coating layer of silicon oxide in contact with a surface of a silicon substrate and a coating layer of a dielectric material subsequently formed on the coating layer of silicon oxide and having a refractive index whose real part is greater than that of silicon oxide.

9. The photodiode array for spectrometric measurements according to claim 6, wherein:
   the antireflection coating commonly includes a coating layer of silicon oxide in contact with a surface of a silicon substrate and a coating layer of a metallic material subsequently formed on the coating layer of silicon oxide.

10. A spectrometric measurement system in which the photodiode array for spectrometric measurements according to claim 1 is used as a detector, wherein:
    the photodiodes of the photodiode array for spectrometric measurements are arrayed in a one-dimensional form in the dispersing direction of wavelength components of light dispersed by a light-dispersing element.

* * * * *